(12) United States Patent
Uebelein et al.

(10) Patent No.: US 6,956,303 B1
(45) Date of Patent: Oct. 18, 2005

(54) ELECTRONIC CONTROL DEVICE FOR CONTROLLING ELECTRIC UNITS OF MOTOR VEHICLE DOORS WHICH HAVE DIFFERENT EQUIPMENT

(75) Inventors: Joerg Uebelein, Grub am Forst (DE); Stephan Stetter, Ebern (DE); Thorsten Mager, Schwalmtal (DE); Gerhard Hofmann, Untersiemau (DE)

(73) Assignee: Brose Fahrzeugteile GmbH & Co. KG, Coburg (DE)

( * ) Notice: Subject to any disclaimer, the term of this patent is extended or adjusted under 35 U.S.C. 154(b) by 284 days.

(21) Appl. No.: 10/129,020

(22) PCT Filed: Oct. 24, 2000

(86) PCT No.: PCT/DE00/03803

§ 371 (c)(1),
(2), (4) Date: Aug. 27, 2002

(87) PCT Pub. No.: WO01/31157

PCT Pub. Date: May 3, 2001

(30) Foreign Application Priority Data

Oct. 28, 1999 (DE) .............................. 199 51 916

(51) Int. Cl.$^7$ ............................................. B60L 1/00
(52) U.S. Cl. .................... 307/10.1; 307/9.1; 361/760; 361/792
(58) Field of Search .............................. 361/760, 792; 307/10.1, 9.1

(56) References Cited

U.S. PATENT DOCUMENTS 3,780,431 A 12/1973 Feeney
5,031,073 A * 7/1991 Chang ......................... 361/778
5,245,258 A * 9/1993 Becker et al. ............... 318/266
5,687,476 A 11/1997 Van Liere
5,757,156 A * 5/1998 Sasajima ..................... 318/456
6,144,114 A * 11/2000 Chutorash ................... 307/10.5

FOREIGN PATENT DOCUMENTS

DE 36 28 981 A1 3/1988
EP 0 482 040 B1 4/1992

OTHER PUBLICATIONS

International Search Report of PCT/DE00/03803, dated Mar. 21, 2001.
International Preliminary Examination Report of PCT/DE00/03803 dated Nov. 22, 2001.

\* cited by examiner

Primary Examiner—Robert L. DeBeradinis
(74) Attorney, Agent, or Firm—Christie, Parker & Hale, LLP

(57) ABSTRACT

An electronic control device for controlling electric units of motor vehicle doors which have different equipment. The control device is formed by at least one printed circuit board, including electronic components which are arranged in a housing and can be contacted to a cable assembly using plug-in connectors. The device includes at least one zone of the printed circuit board with an identical assembly of components that can be used for at least two variants of the motor-vehicle-door equipment, the printed circuit board having a reduced component assembly for at least one of the equipment variants. The printed circuit board of one equipment variant is spatially integrated into a housing of a unit which is to be controlled, while the printed circuit board of another equipment variant is located in a separate housing.

11 Claims, 3 Drawing Sheets

ELECTRONIC CONTROL DEVICE FOR CONTROLLING ELECTRIC UNITS OF MOTOR VEHICLE DOORS WHICH HAVE DIFFERENT EQUIPMENT

CROSS-REFERENCE TO RELATED APPLICATION

This application claims priority of International application number PCT/DE00/03803, filed Oct. 24, 2000, which in turn claims priority of German application number 199 51 916.1, filed Oct. 28, 1999.

FIELD

The invention relates to an electronic control device for controlling electric units of motor vehicles with different equipment variants.

BACKGROUND

EP 0 482 040 B1 discloses an electronic control unit for a window lifter. It comprises a printed circuit board with a tongue-like projection having electric contact elements positioned at its free end for powering the motor and Hall elements for speed detection. The printed circuit board is surrounded by a housing which is open in the region of the tongue-like projection, exposing this projection. The opening of the electronic housing exactly faces the opening of a gear housing, so that, on completion of assembly, the two housing parts form a common closed housing.

With respect to its assembly of electronic components and with respect to its housing-side interfaces, the described electronic control device is a technical solution for very specific applications, which cannot be adapted to changed requirements, for example on different equipment variants. Special electronic variants are, in turn, being developed and produced for this purpose.

SUMMARY

It is the object of the invention to develop an electronic control device for controlling electronic units of motor vehicle doors so as to permit simple use of the same printed circuit board even in different equipment variants of the vehicle door, wherein the layout of the printed circuit board according to the equipment variants is to be substantially retained. Furthermore, the control device should fulfill the differing requirement for integration and contacting with the electric units to be controlled.

According to the invention, a control device uses at least one zone of a printed circuit board with an identical assembly of components for at least two variants of the motor vehicle door equipment. The printed circuit board has a reduced component assembly for one of the equipment variants. The printed circuit board of one equipment variant is spatially integrated into a housing of a unit which is to be controlled while the printed circuit board of another equipment variant is arranged in a separate housing.

According to a preferred embodiment of the invention, the electronic components for controlling an electric unit, for example the window lifter motor or a plurality of electric units, for example electric mirror adjustment and mirror heating, are arranged on connected zones of the printed circuit board according to an equipment variant. If these connected zones adjoin the edge of the printed circuit board, it is possible, with a reduced component assembly, not to provide the unnecessary zone at all or to separate it from the printed circuit board, saving materials and space.

According to a further embodiment, the electronic components for controlling one or more electric units according to an equipment variant are arranged on separate smaller printed circuit boards which may be attached to a further printed circuit board by soldering or by electric plug-in connectors.

According to a further preferred embodiment, the printed circuit board is arranged in an open housing, the rim of such opening may be engaged exactly with the housing of at least one of the electric units to be controlled in such a way that the two open housings form a closed housing once combined. With a corresponding combination of an electrically operated window lifter and the electronic control device the control device can also carry, on the printed circuit board next to the power relay, means for making electric contact with the motor and the sensor devices. If a ring magnet is fastened on the motor shaft to generate speed signals, Hall sensors are placed at suitable points of the printed circuit board. The zone of the printed circuit board provided for the power supply and equipped with sensor devices should preferably be tongue-like in construction to allow the simplest intervention in the engine compartment. For cable-free electric coupling of the unit to be controlled with the printed circuit board, however, a contact element or coupler may also be provided, which may be connected to the printed circuit board and carries the electric contact elements as well as the sensor devices for speed control. A coupler of this type may be designed, for example, as an MIT (molded interconnect) part.

In a compact embodiment of the invention, the housing of the printed circuit board has a substantially L-shaped cross-section, a first housing arm being as flat as possible in construction for receiving the printed circuit board. The other, comparatively thicker second housing arm receives the electric plug-in connector, the plug-in elements being arranged on the interior of the housing arm so the plug-in direction extends parallel to the other housing arm. Thus, the electronic control device may easily be spatially stacked with the unit to be controlled. For example, the pole tube of a bar-wound armature motor may be arranged between the two L-shaped housing arms.

BRIEF DESCRIPTION OF THE DRAWINGS

The invention will be described in more detail hereinafter with reference to exemplary embodiments shown in the drawings, in which.

DETAILED DESCRIPTION OF THE INVENTION

Figure 1:
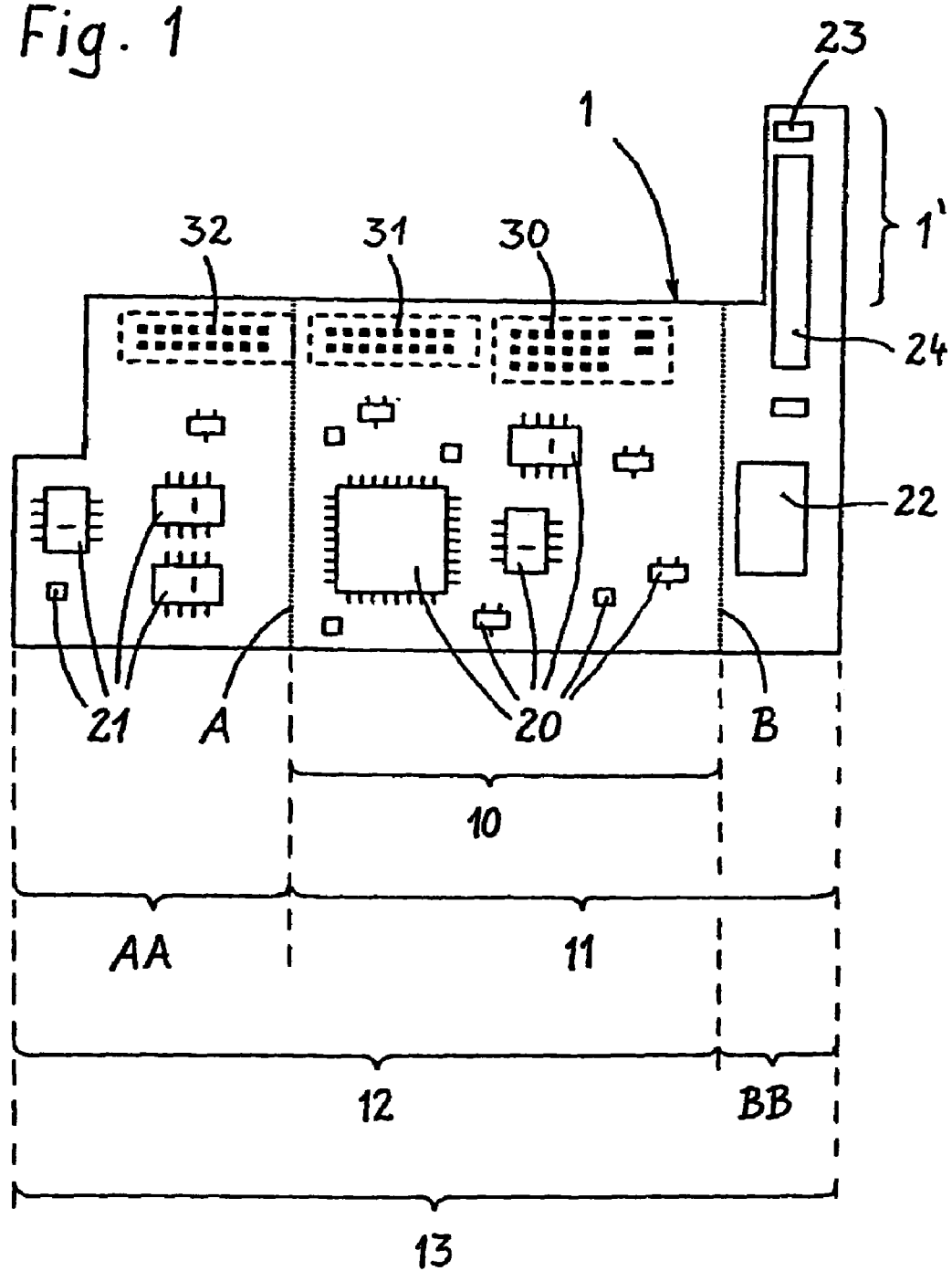
FIG. 1 shows a printed circuit board with a plurality of zones for receiving electronic components for different equipment variants.

FIG. 1 shows an embodiment of a printed circuit board 1 for an electronic control device for making direct contact with a unit to be controlled, in particular a window lifter operated by an electric motor, according to the proposed maximum equipment variant of a vehicle door. The electric contact elements 23 and sensor elements 24 are accordingly placed in a tongue-like zone 1' and reach the proposed position with respect to the motor when the drive housing and the control device housing are joined together. A relay 22 for connecting the power supply to the motor 5 (shown in FIG. 4) is located beneath the tongue-like zone 1'.

Adjoining on the other side of a zone limit B is a base zone 10 of the printed circuit board 1 which ends at the zone limit A. The electronic components 20 and the connectors 30 and 31 of zone 10 represent the reduced assembly of components corresponding to the minimum proposed equipment variant of the vehicle door. This could be, for example, the central locking control, the central power supply and the interlinking of the bus system taking place via the connector 30 and the connection to the pushbutton and switch arranged in the interior door trim taking place via the connector 31.

In the minimum proposed equipment variant of the vehicle door (only central locking), the printed circuit board 1 is efficiently restricted to the zone 10 and is arranged in a separate electronics housing. In this embodiment, the layout of the corresponding printed circuit board zone 10 can be substantially unchanged in comparison with the layout of a more highly equipped printed circuit board 1; modification to printed circuit board assembly machines is not necessary either. The printed circuit board 1, which is intended for high quality equipment or for maximum equipment, may also be used for reduced equipment. This might be worthwhile if the respective equipment variant is ordered so rarely that it is uneconomical to provide the restricted size of printed circuit board with, possibly, a further housing.

To the left of the zone limit A, the adjoining zone AA carries the electronic components 21 for the mirror controller and associated connectors 32. This zone AA, similar to the zone BB, is not a standalone equipment variant because all zones AA, BB, and 10 are powered via the connector 30. Therefore, the embodiment of the described printed circuit board 1, may produce the following equipment variants:

With a complete assembly of components on the printed circuit board 1 (zone 13), the maximum equipment with control of central locking, window lifter and mirror. The control device is electrically connected directly to the window lifter drive and is accommodated in a common housing.

Omission of the zone AA leaves a zone 11 with an assembly of components representing the control of central locking and window lifter. A direct connection between the printed circuit board 1 and the window lifter drive may be worthwhile in this embodiment.

If no electrically operated window lifters are ordered, the assembly of components in zone BB or the entire zone BE of the printed circuit board 1 may be omitted. Therefore, the printed circuit board 1 in this embodiment contains the elements for controlling the central locking and the mirror and is placed in a separate housing so the printed circuit board 1 does not have a direct connection (for example one produced by soldering or plugging in) to one of the units to be controlled, in other words to a lock or mirror.

As already mentioned, the assembly of components only in zone 10 results in the reduced equipment which controls only the vehicle locks. The control device is also contained in a separate housing in this case.

Owing to the arrangement of the electronic components 21, 22, 23, and 24, associated with the optional equipment features, at the edges (zones AA, BB) of a basic equipment variant according to the zone 10 of the printed circuit board, it is easy to considerably reduce the material and production costs for manufacturing the various equipment variants in comparison with conventional methods. At the same time, if desired, the printed circuit board may be directly connected to a unit to be controlled, for example in order to integrate the sensors into the printed circuit board 1.

Figure 2:
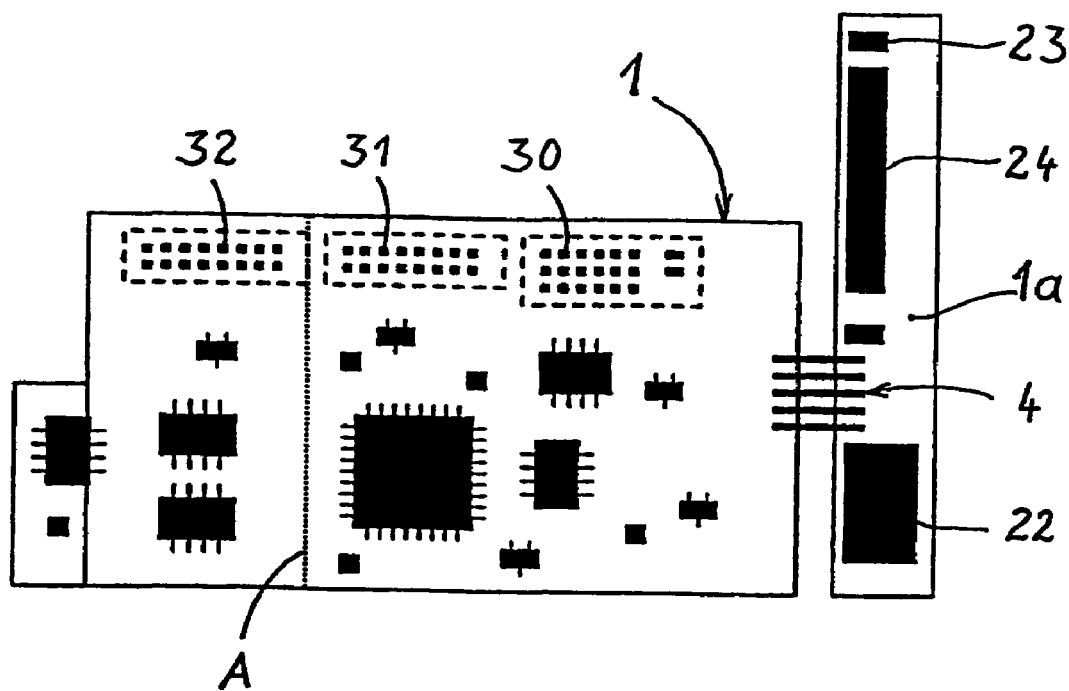
FIG. 2 shows a basic printed circuit board with a plurality of zones for receiving electronic components for different equipment variants and a further separate printed circuit board, which may be connected thereto, for making cable-free contact with a window lifter motor.
Figure 3:
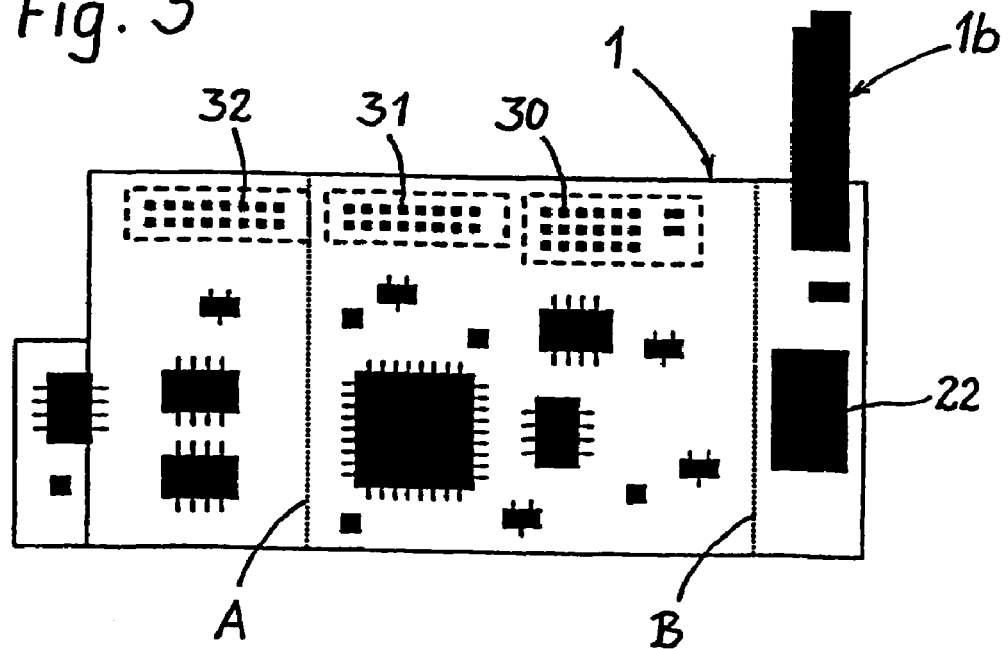
FIG. 3 shows a basic printed circuit board with a plurality of zones for receiving electronic components for different equipment variants and a separate coupler, which may be connected thereto, for making cable-free contact with a window lifter motor.

The embodiments in FIGS. 2 and 3 are functionally the same and produce the same possible equipment variants. They merely have constructional differences for producing the described variants.

FIG. 2 accordingly shows a separate part of the printed circuit board 1a with components 22, 23, and 24 which are functionally related solely for controlling the window lifter drive. A connection 4 which may be produced by plugging in or soldering is shown schematically for connecting the separate printed circuit board 1a to the basic printed circuit board 1. A connection of this type can also be provided at the zone limit A. This affords the advantage that the desired equipment variants can be made up as required from prefabricated individual printed circuit boards.

Rather than the tongue-like zone 1' of the printed circuit board 1 shown in FIG. 1, the embodiment of FIG. 3 uses a coupler 1b, preferably in the form of an MID element. The coupler 1b may be connected to the printed circuit board 1 by plugging it in and it may carry the means for making electric contact with the motor and the sensor devices.

Figure 4:
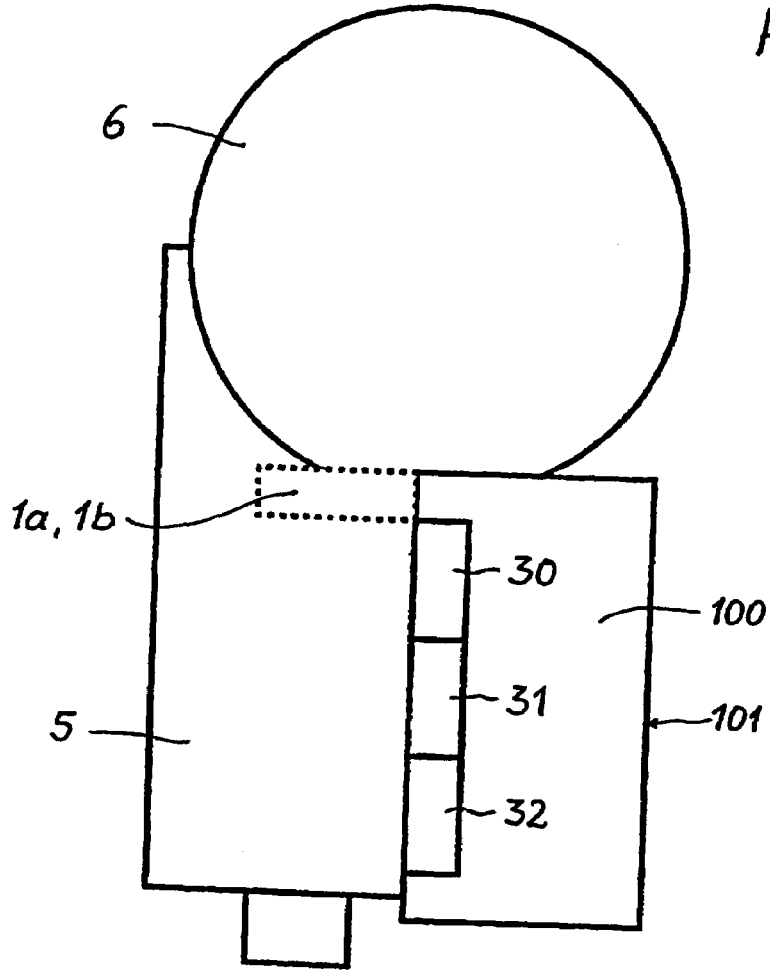
FIG. 4 is a schematic view of a drive with motor, gearing and electronic control device.

FIG. 4 is a schematic view of a window lifter drive with a bar-wound armature motor, where the motor shaft (not shown) interacts with a gear 6. It is also indicated that a tongue-like part 1a, 1b connected to the printed circuit board 1 engages in the motor zone and produces a direct electric coupling between the printed circuit board 1 and the motor 5. The electric connectors 30, 31, and 32 adjoin the pole tube of the bar-wound armature motor.

Figure 5:
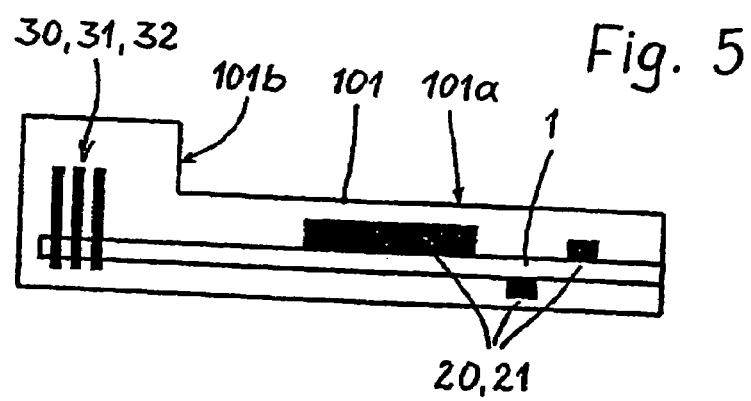
FIG. 5 is a schematic view of a section through an electronic control device.

FIG. 5 is a schematic cross-section through the housing 101 of the electronic control device 100. The housing 101 has an L-shaped contour, wherein the printed circuit board 1 with the electronic components 20 and 21 are arranged in the comparatively flat housing arm 101a and the connectors 30, 31, and 32 are arranged in the comparatively broad housing arm 101b. A plug-in direction extending transversely to the arm 101a is shown in this illustration. However, the connectors 30, 31, and 32 could also be connected to the printed circuit board 1 in such a way that the plug-in direction extends parallel to the arm 101a on the inner side thereof, thus obviating the need for an increase in height in the region of the housing arm 101b.

What is claimed is:

1. An electronic control device for controlling electric units of equipment variants of a motor vehicle door, the control device comprising a printed circuit-board having a base zone and adjacent to the base zone at least one side zone, the circuit-board comprising an assembly of electronic components which are arranged in a housing and contactable with a cable assembly using plug-in connectors, wherein for one equipment variant of the vehicle door, the device includes at least the base zone, and for at least a second equipment variant of the door, the device includes the base zone and at least one side zone, of which the base zone of the printed circuit-board of the at least two equipment variants comprises an identical assembly of electronic components for controlling an identical electric base unit of the at least two equipment variants of the vehicle door, and the at least one side zone comprises an assembly of components that interact with the base zone for controlling an electric unit of the vehicle door different from the electric base unit, wherein the printed circuit-board of one equipment variant is spatially integrated into a housing of a unit which is to be controlled while the printed circuit-board of another equipment variant is arranged in a separate housing.

2. The electronic control device according to claim 1, wherein the electronic components for controlling one of an electric unit and a plurality of electric units according to an equipment variant are arranged on connected zones of the printed circuit-board, which connected zones are located at an edge of the printed circuit-board.

3. The electronic control device according to claim 1, wherein, with a reduced component assembly on the printed circuit-board, the at least one side zone is one of not provided with an assembly of electronic components and provided on a separate circuit board.

4. The electronic control device according to claim 1, wherein the electronic components for controlling one of an electric unit and a plurality of electric units according to an equipment variant are arranged on separate parts comprising the base zone and at least one side zone of the printed circuit-board which may be mutually connected by one of soldering and plugging in.

5. The electronic control device according to at least one of the preceding claims, wherein the housing of the printed circuit-board and the housing of the electric unit to be controlled are open and are so constructed that they may be joined together to form a common closed housing.

6. The electronic control device according to claim 5, wherein, for cable-free electrical coupling of the electric unit to be controlled and the printed circuit-board, a protruding zone carrying electric contact elements and optionally sensor devices for speed detection is shaped integrally on the printed circuit-board.

7. The electronic control device according to claim 5, wherein, for cable-free electrical coupling of the electric unit to be controlled and the printed circuit-board there is provided a coupler which is connectable to the printed circuit-board and carries electric contact elements and optionally sensor devices for speed control.

8. The electronic control device according to claim 7, wherein the coupler is designed as a molded interconnect element.

9. The electronic control device according to claim 1, wherein the housing of the printed circuit-board has a substantially L-shaped cross-section, with one housing arm having a flat construction for receiving the printed circuit-board and another comparatively thicker housing arm for receiving the plug-in connectors on one of an inner face and an end face of the thicker housing arm, a plug-in direction extending one of parallel and transversely to the other arm of the housing.

10. The electronic control device according to claim 1, wherein, the electric unit is a window lifter operated by a bar-wound armature motor and where a housing arm equipped with the plug-in connectors extends in an immediate vicinity of a pole tube of the bar-wound armature motor and parallel thereto.

11. A series of electronic control devices for controlling electric units of equipment variants of a motor vehicle door, each of the series of electronic control devices comprising a circuit board with a predetermined layout and a base zone with predetermined locations for electronic components and at least one side zone adjacent to the base zone with predetermined locations for electronic components, the printed-circuit board being arranged in a housing and contactable with a cable assembly using plug-in connectors, wherein electronic components are installed in the base zone for controlling an electric base unit for a first equipment variant, and for at least a second equipment variant the base zone is installed with the same electronic components as in the first equipment variant for controlling an identical electric base unit and the at least one side zone is installed with electronic components and interact with the base unit for controlling an electric unit different than the electric base unit, wherein the printed circuit-board of one of the series of electronic control devices equipment variants is spatially integrated into a housing of a unit which is to be controlled while the printed circuit-board of another equipment variant is arranged in a separate housing.

* * * * *